United States Patent
Hong et al.

(10) Patent No.: US 8,325,450 B2
(45) Date of Patent: Dec. 4, 2012

(54) LOW RESISTANCE TUNNEL MAGNETORESISTANCE (TMR) STRUCTURE

(75) Inventors: Ying Hong, Morgan Hill, CA (US); Kochan Ju, Monte Sereno, CA (US); Tsann Lin, Saratoga, CA (US); Ching Hwa Tsang, Sunnyvale, CA (US)

(73) Assignee: Hitachi Global Storage Technologies Netherlands B.V., Amsterdam (NL)

(*) Notice: Subject to any disclaimer, the term of this patent is extended or adjusted under 35 U.S.C. 154(b) by 983 days.

(21) Appl. No.: 12/332,010

(22) Filed: Dec. 10, 2008

(65) Prior Publication Data
US 2010/0142099 A1    Jun. 10, 2010

(51) Int. Cl.
G01B 5/66    (2006.01)

(52) U.S. Cl. .............. 360/324.2; 427/128; 427/130

(58) Field of Classification Search .............. None
See application file for complete search history.

(56) References Cited

U.S. PATENT DOCUMENTS

| | | |
|---|---|---|
| 6,710,986 B1 | 3/2004 | Sato et al. ............ 360/324.2 |
| 6,780,524 B2* | 8/2004 | Lin et al. ............ 428/814 |
| 6,937,446 B2 | 8/2005 | Kamiguchi et al. ........ 360/324.1 |
| 6,960,397 B2 | 11/2005 | Lee et al. ............ 428/689 |
| 7,059,201 B2 | 6/2006 | Prakash et al. ........ 73/862.041 |
| 7,151,654 B1 | 12/2006 | Mao et al. ............ 360/324.2 |
| 7,220,498 B2 | 5/2007 | Nagahama et al. ........ 428/811.1 |
| 2004/0257714 A1 | 12/2004 | Takahashi et al. ........ 360/322 |
| 2005/0025999 A1 | 2/2005 | Gill ............ 428/694 |
| 2006/0044703 A1 | 3/2006 | Inomata et al. ........ 360/324.1 |
| 2006/0067010 A1 | 3/2006 | Kagami et al. ........ 360/324.1 |
| 2007/0047159 A1 | 3/2007 | Zhao et al. ........ 360/324.12 |
| 2007/0111332 A1* | 5/2007 | Zhao et al. ........ 438/3 |
| 2008/0261082 A1* | 10/2008 | Nishimura et al. ........ 428/846.8 |
| 2010/0073827 A1* | 3/2010 | Zhao et al. ........ 360/324.2 |

OTHER PUBLICATIONS

Mao et al., "Tunneling Magnetoresistive Heads Beyond 150 Gb/in$^2$" IEEE Transactions on Magnetics, vol. 40, No. 1, Jan. 2004.
Tanaka et al., "Readout Performance of Confined-Current-Path Current-Perpendicular-to-Plane Heads" IEEE Transactions on Magnetics, vol. 40, No. 1, Jan. 2004.
Ohashi et al., "Low-Resistance Tunnel Magnetoresistive Head" IEEE Transactions On Magnetics, vol. 36, No. 5, Sep. 2000.
Wang et al., "70% TMR at Room Temperature for SDT Sandwich Junctions With CoFeB as Free and Reference Layers" IEEE Transactions on Magnetics, vol. 40, No. 4, Jul. 2004.
Li K. B et al., "Overall performance of spin-valves using CoFe/Cu/FoFe as free FM layers" Magnetics Conference 2002, INTERMAG Europe 2002. Digest of Technical Papers. 2002 IEEE International, p. EW4.

* cited by examiner

*Primary Examiner* — Holly Rickman
(74) *Attorney, Agent, or Firm* — Zilka-Kotab, PC

(57) ABSTRACT

A magnetic structure in one embodiment includes a tunnel barrier layer; a free layer; and a buffer layer between the tunnel barrier layer and the free layer, wherein a cross sectional area of the tunnel barrier layer in a direction parallel to a plane of deposition thereof is greater than a cross sectional area of the free layer in a direction parallel to a plane of deposition thereof, wherein a cross sectional area of the buffer layer in a direction parallel to a plane of deposition thereof is greater than a cross sectional area of the free layer in the direction parallel to the plane of deposition thereof. Additional systems and methods are also presented.

25 Claims, 9 Drawing Sheets

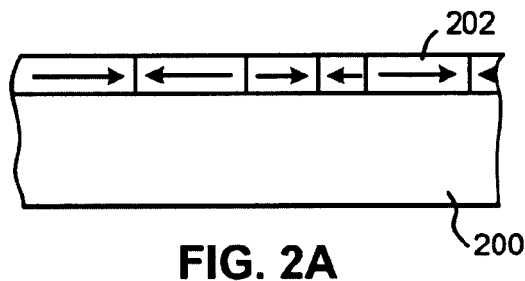
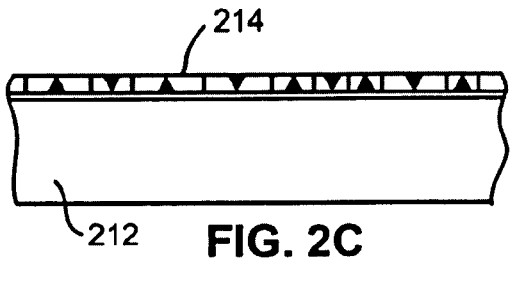
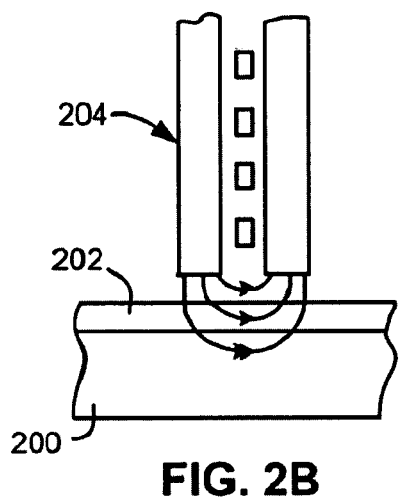
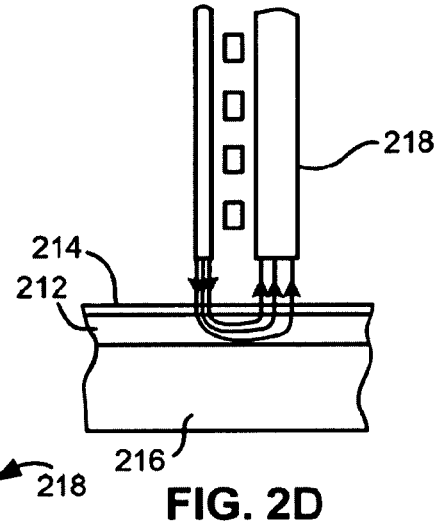
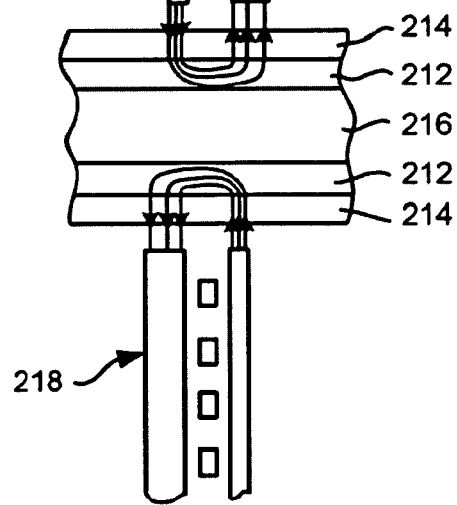
FIG. 2A
FIG. 2B
FIG. 2C
FIG. 2D
FIG. 2E

LOW RESISTANCE TUNNEL MAGNETORESISTANCE (TMR) STRUCTURE

FIELD OF THE INVENTION

The present invention relates to thin film sensor structures, and more particularly, this invention relates to tunnel magnetoresistance (TMR) structures.

BACKGROUND OF THE INVENTION

The heart of a computer is a magnetic disk drive which typically includes a rotating magnetic disk, a slider that has read and write heads, a suspension arm above the rotating disk and an actuator arm that swings the suspension arm to place the read and/or write heads over selected circular tracks on the rotating disk. The suspension arm biases the slider into contact with the surface of the disk when the disk is not rotating but, when the disk rotates, air is swirled by the rotating disk adjacent an air bearing surface (ABS) of the slider causing the slider to ride on an air bearing a slight distance from the surface of the rotating disk. When the slider rides on the air bearing the write and read heads are employed for writing magnetic impressions to and reading magnetic signal fields from the rotating disk. The read and write heads are connected to processing circuitry that operates according to a computer program to implement the writing and reading functions.

SUMMARY OF THE INVENTION

A magnetic structure in one embodiment includes a tunnel barrier layer; a free layer; and a buffer layer between the tunnel barrier layer and the free layer, wherein a cross sectional area of the tunnel barrier layer in a direction parallel to a plane of deposition thereof is greater than a cross sectional area of the free layer in a direction parallel to a plane of deposition thereof, wherein a cross sectional area of the buffer layer in a direction parallel to a plane of deposition thereof is greater than a cross sectional area of the free layer in the direction parallel to the plane of deposition thereof.

A magnetic structure according to another embodiment includes a tunnel barrier layer; a free layer; and a buffer layer between and immediately adjacent the tunnel barrier layer and the free layer, wherein cross sectional areas of the tunnel barrier layer and the buffer layer in a direction parallel to planes of deposition thereof are each greater than a cross sectional area of the free layer in a direction parallel to a plane of deposition thereof, wherein the structure has an air bearing surface.

A magnetic storage system according to yet another embodiment includes magnetic media; at least one head for reading from and writing to the magnetic media, the at least one head having: a sensor, comprising: a tunnel barrier layer; a free layer; and a buffer layer between the tunnel barrier layer and the free layer. A cross sectional area of the tunnel barrier layer in a direction parallel to a plane of deposition thereof is greater than a cross sectional area of the free layer in a direction parallel to a plane of deposition thereof. A cross sectional area of the buffer layer in a direction parallel to a plane of deposition thereof is greater than a cross sectional area of the free layer in the direction parallel to the plane of deposition thereof. The system also includes a slider for supporting the head; and a control unit coupled to the head for controlling operation of the head.

A method in one embodiment includes forming a tunnel barrier layer; forming a buffer layer above the barrier layer; and forming a free layer above the buffer layer such that a cross sectional area of the tunnel barrier layer in a direction parallel to a plane of deposition thereof is greater than a cross sectional area of the free layer in a direction parallel to a plane of deposition thereof, and such that a cross sectional area of the buffer layer in a direction parallel to a plane of deposition thereof is greater than a cross sectional area of the free layer in the direction parallel to the plane of deposition thereof.

A method in another embodiment includes forming a free layer; forming a buffer layer above the free layer; and forming a tunnel barrier layer above the buffer layer, wherein a cross sectional area of the tunnel barrier layer in a direction parallel to a plane of deposition thereof is greater than a cross sectional area of the free layer in a direction parallel to a plane of deposition thereof, wherein a cross sectional area of the buffer layer in a direction parallel to a plane of deposition thereof is greater than a cross sectional area of the free layer in the direction parallel to the plane of deposition thereof.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

FIG. 2A is a schematic representation in section of a recording medium utilizing a longitudinal recording format.

FIG. 2B is a schematic representation of a conventional magnetic recording head and recording medium combination for longitudinal recording as in FIG. 1.

FIG. 2C is a magnetic recording medium utilizing a perpendicular recording format.

FIG. 2D is a schematic representation of a recording head and recording medium combination for perpendicular recording on one side.

FIG. 2E is a schematic representation of the recording apparatus in accordance with one embodiment, similar to that of FIG. 2D, but adapted for recording separately on both sides of the medium.

DETAILED DESCRIPTION

Figure 1:
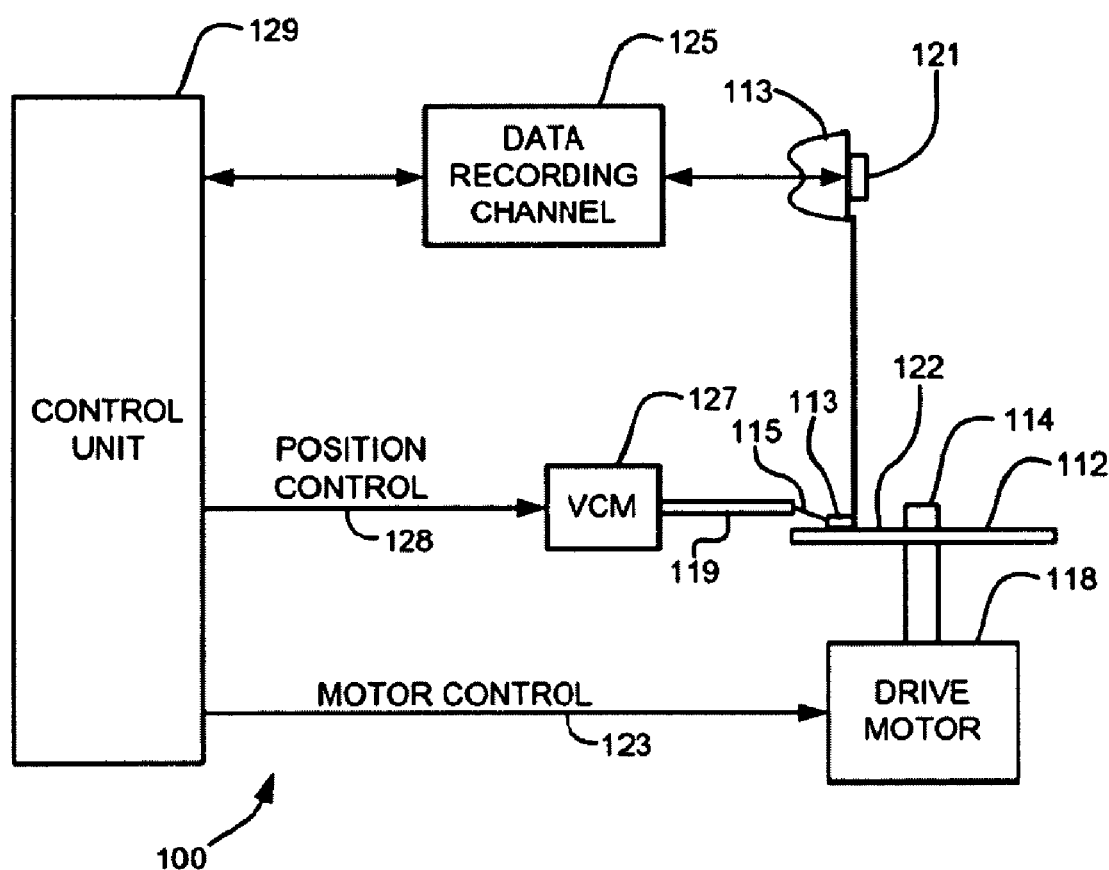
FIG. 1 is a simplified drawing of a magnetic recording disk drive system.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

The following description discloses several preferred embodiments of thin film TMR sensors, as well as magnetic storage systems implementing the same and methods of fabrication.

In one general embodiment, a magnetic structure is provided including a tunnel barrier layer, a free layer, and a buffer layer between the tunnel barrier layer and the free layer, wherein a cross sectional area of the tunnel barrier layer in a plane parallel to a plane of deposition thereof is greater than a cross sectional area of the free layer in a plane parallel to a plane of deposition thereof, and a cross sectional area of the buffer layer in a plane parallel to a plane of deposition thereof is greater than a cross sectional area of the free layer in the plane parallel to the plane of deposition thereof.

In another general embodiment, a magnetic structure is provided including a tunnel barrier layer, a free layer, and a buffer layer between and immediately adjacent the tunnel barrier layer and the free layer, wherein cross sectional areas of the tunnel barrier layer and the buffer layer in a plane parallel to planes of deposition thereof are each greater than a cross sectional area of the free layer in a plane parallel to a plane of deposition thereof, wherein the structure has an air bearing surface.

In another general embodiment, a magnetic structure is provided including magnetic media. Further, at least one head is provided for reading from and writing to the magnetic media, the at least one head having a sensor comprising a tunnel barrier layer, a free layer, and a buffer layer between the tunnel barrier layer and the free layer, wherein a cross sectional area of the tunnel barrier layer in a plane parallel to a plane of deposition thereof is greater than a cross sectional area of the free layer in a plane parallel to a plane of deposition thereof, and a cross sectional area of the buffer layer in a plane parallel to a plane of deposition thereof is greater than a cross sectional area of the free layer in the plane parallel to the plane of deposition thereof. Additionally, a slider is included for supporting the head. Still yet, a control unit coupled to the head is included for controlling operation of the head.

In still another general embodiment, a method for fabricating a magnetic structure is provided. In operation, a tunnel barrier layer is formed. Additionally, a buffer layer is formed above the barrier layer. Further, a free layer is formed above the buffer layer such that a cross sectional area of the tunnel barrier layer in a plane parallel to a plane of deposition thereof is greater than a cross sectional area of the free layer in a plane parallel to a plane of deposition thereof, and such that a cross sectional area of the buffer layer in a plane parallel to a plane of deposition thereof is greater than a cross sectional area of the free layer in the plane parallel to the plane of deposition thereof.

In yet another general embodiment, a method for fabricating a magnetic structure is provided. In operation, a free layer is formed. Further, a buffer layer is formed above the free layer. Still yet, a tunnel barrier layer is formed above the buffer layer, wherein a cross sectional area of the tunnel barrier layer in a plane parallel to a plane of deposition thereof is greater than a cross sectional area of the free layer in a plane parallel to a plane of deposition thereof, and a cross sectional area of the buffer layer in a plane parallel to a plane of deposition thereof is greater than a cross sectional area of the free layer in the plane parallel to the plane of deposition thereof.

Referring now to FIG. 1, there is shown a disk drive 100 in accordance with one embodiment of the present invention. As shown in FIG. 1, at least one rotatable magnetic disk 112 is supported on a spindle 114 and rotated by a disk drive motor 118. The magnetic recording on each disk is in the form of an annular pattern of concentric data tracks (not shown) on the disk 112.

At least one slider 113 is positioned near the disk 112, each slider 113 supporting one or more magnetic read/write heads 121. As the disks rotate, slider 113 is moved radially in and out over disk surface 122 so that heads 121 may access different tracks of the disk where desired data are recorded. Each slider 113 is attached to an actuator arm 119 by means of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of disk 112 generates an air bearing between slider 113 and disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Read and write signals are communicated to and from read/write heads 121 by way of recording channel 125.

The above description of a typical magnetic disk storage system, and the accompanying illustration of FIG. 1 are for representation purposes only. It should be apparent that disk storage systems may contain a large number of disks and actuators, and each actuator may support a number of sliders.

An interface may also be provided for communication between the disk drive and a host (integral or external) to send and receive the data and for controlling the operation of the disk drive and communicating the status of the disk drive to the host, all as will be understood by those of skill in the art.

In a typical head, an inductive write head includes a coil layer embedded in one or more insulation layers (insulation stack), the insulation stack being located between first and second pole piece layers. A gap is formed between the first and second pole piece layers by a gap layer at an air bearing surface (ABS) of the write head. The pole piece layers may be connected at a back gap. Currents are conducted through the coil layer, which produce magnetic fields in the pole pieces. The magnetic fields fringe across the gap at the ABS for the purpose of writing bits of magnetic field information in tracks on moving media, such as in circular tracks on a rotating magnetic disk.

The second pole piece layer has a pole tip portion which extends from the ABS to a flare point and a yoke portion which extends from the flare point to the back gap. The flare point is where the second pole piece begins to widen (flare) to form the yoke. The placement of the flare point directly affects the magnitude of the magnetic field produced to write information on the recording medium. Since magnetic flux decays as it travels down the length of the narrow second pole tip, shortening the second pole tip will increase the flux reaching the recording media. Therefore, performance can be optimized by aggressively placing the flare point close to the ABS.

FIG. 2A illustrates, schematically, a conventional recording medium such as used with conventional magnetic disc recording systems, such as that shown in FIG. 1. This medium is utilized for recording magnetic impulses in or parallel to the plane of the medium itself. The recording medium, a recording disc in this instance, comprises basically a supporting substrate 200 of a suitable non-magnetic material such as glass, with an overlying coating 202 of a suitable and conventional magnetic layer.

FIG. 2B shows the operative relationship between a conventional recording/playback head 204, which may preferably be a thin film head, and a conventional recording medium, such as that of FIG. 2A.

FIG. 2C illustrates schematically the orientation of magnetic impulses substantially perpendicular to the surface of the recording medium. For such perpendicular recording the medium includes an under layer 212 of a material having a high magnetic permeability. This under layer 212 is then provided with an overlying coating 214 of magnetic material preferably having a high coercivity relative to the under layer 212.

Two embodiments of storage systems with perpendicular heads 218 are illustrated in FIGS. 2C and 2D (not drawn to scale). The recording medium illustrated in FIG. 2D includes both the high permeability under layer 212 and the overlying coating 214 of magnetic material described with respect to FIG. 2C above. However, both of these layers 212 and 214 are shown applied to a suitable substrate 216. Typically there is also an additional layer (not shown) called an "exchange-break" layer or "interlayer" between layers 212 and 214.

By this structure the magnetic lines of flux extending between the poles of the recording head loop into and out of the outer surface of the recording medium coating with the high permeability under layer of the recording medium causing the lines of flux to pass through the coating in a direction generally perpendicular to the surface of the medium to record information in the magnetically hard coating of the medium in the form of magnetic impulses having their axes of magnetization substantially perpendicular to the surface of the medium. The flux is channeled by the soft underlying coating 212 back to the return layer (P1) of the head 218.

FIG. 2E illustrates a similar structure in which the substrate 216 carries the layers 212 and 214 on each of its two opposed sides, with suitable recording heads 218 positioned adjacent the outer surface of the magnetic coating 214 on each side of the medium.

Figure 3A:
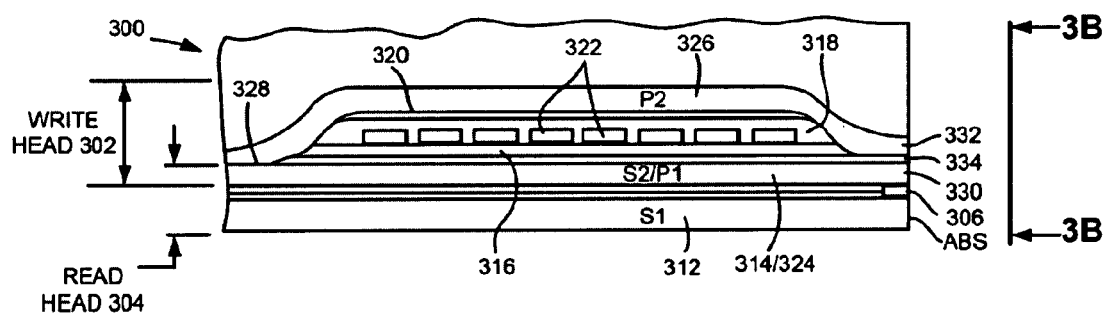
FIG. 3A is a partial view of a merged magnetic head.
Figure 3B:
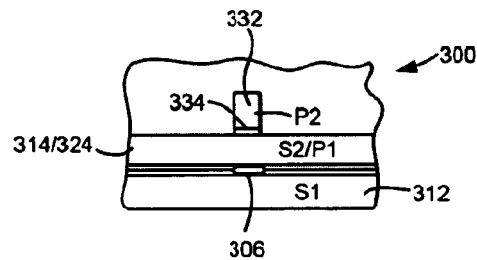
FIG. 3B is a partial ABS view, not to scale, of the slider taken along plane 3B-3B of FIG. 3A.

FIG. 3A is a side cross-sectional elevation view of a merged magnetic head 300, which includes a write head portion 302 and a read head portion 304, the read head portion employing a magnetic tunnel junction (MTJ) sensor 306. FIG. 3B is an ABS view of FIG. 3A. The sensor 306 is sandwiched between ferromagnetic first and second shield layers 312 and 314. In response to external magnetic fields, the resistance of the sensor 306 changes. A sense current conducted through the sensor causes these resistance changes to be manifested as potential changes. These potential changes may then be processed as readback signals by processing circuitry (e.g. processing circuitry of the control unit 129 shown in FIG. 1).

MTJ sensors are typically current-perpendicular-to-plane (CPP) devices, where the sensing current flows from one shield to the other shield in a direction perpendicular to the plane of the layers forming the sensor. A typical MTJ device comprises two ferromagnetic layers separated by a thin, electrically insulating, tunnel barrier layer. The tunnel barrier layer is sufficiently thin that quantum-mechanical tunneling of charge carriers occurs between the ferromagnetic layers. The tunneling process is electron spin dependent, which means that the tunneling current across the junction depends on the spin-dependent electronic properties of the ferromagnetic materials and is a function of the relative orientation of the magnetic moments, or magnetization directions, of the two ferromagnetic layers. In the MTJ sensor, one ferromagnetic layer has its magnetic moment fixed, or pinned, and the other ferromagnetic layer has its magnetic moment free to rotate in response to an external magnetic field from the recording medium (the signal field). When an electric potential is applied between the two ferromagnetic layers, the sensor resistance is a function of the tunneling current across the insulating layer between the ferromagnetic layers. Since the tunneling current that flows perpendicularly through the tunnel barrier layer depends on the relative magnetization directions of the two ferromagnetic layers, recorded data can be read from a magnetic medium because the signal field causes a change of direction of magnetization of the free layer, which in turn causes a change in resistance of the MTJ sensor and a corresponding change in the sensed current or voltage.

The write head portion 302 of the magnetic head 300 includes a coil layer 322 sandwiched between first and second insulation layers 316 and 318. Note that the coils 322 are only partially shown, additional portions thereof being present outside the diagram. A third insulation layer 320 may be employed for planarizing the head to eliminate ripples in the second insulation layer caused by the coil layer 322. The first, second and third insulation layers are referred to in the art as an "insulation stack".

The coil layer 322 and the first, second and third insulation layers 316, 318 and 320 are sandwiched between first and second pole piece layers 324 and 326. The first and second pole piece layers 324 and 326 are magnetically coupled at a back gap 328 and have first and second pole tips 330 and 332 which are separated by a write gap layer 334 at the ABS. Since the second shield layer 314 and the first pole piece layer 324 are a common layer this head is known as a merged head. In a piggyback head, an insulation layer is located between a second shield layer and a first pole piece layer. First and second solder connections (not shown) connect leads (not shown) from the spin valve sensor 306 to leads (not shown) on the slider 113 (FIG. 1), and third and fourth solder connections (not shown) connect leads (not shown) from the coil 322 to leads (not shown) on the suspension.

In very high areal density applications, magnetic heads constructed with small sensor areas sometimes experience issues because of large head resistances. Such large head resistances may seriously degrade the signal to noise ratio (SNR) because of large shot noise and also degrade head yield through heightened sensitivity to damages from electrostatic discharge (ESD). One approach to reducing head resistance is to reduce the areal resistance (RA) of sensor films [e.g. tunnel magnetoresistance (TMR) films, etc], subject to challenges from the viability of very thin tunnel barriers.

Another approach is to increase the sensor height, which may degrade performance due to a larger free layer magnetic noise increase, lower signal utilization, and worse readback asymmetries. Yet another approach is to shunt the sensor with a resistor, which would degrade instead of improve the SNR due to shunting of the TMR coefficient and the introduction of noise from the shunt resistor. In contrast, using a TMR head design that significantly reduces the head resistance below the conventional value of RA/sensing area improves the SNR and head yield, without the undesired characteristics inherent in the previously mentioned approaches.

Figure 4A:
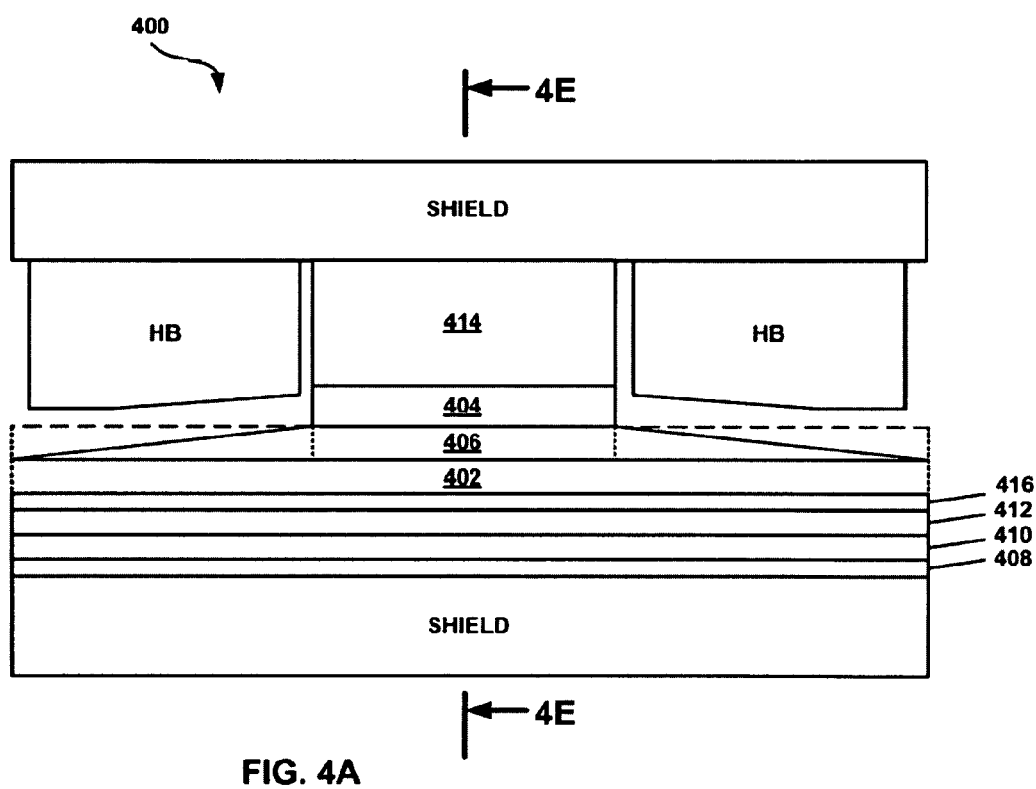
FIG. 4A illustrates an air bearing surface (ABS) view of a magnetic structure, in accordance with one embodiment.
Figure 4B:
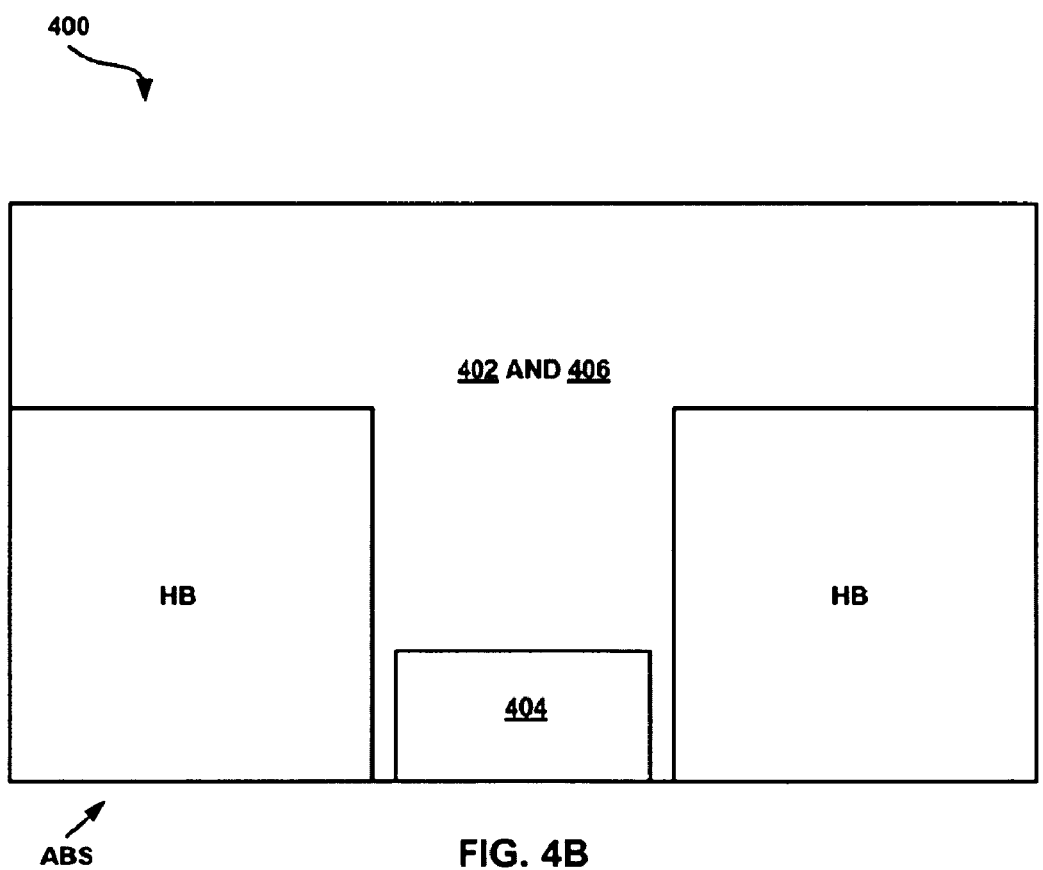
FIGS. 4B-4D illustrate top town views of the magnetic structure FIG. 4A, in accordance with various embodiments.
Figure 4C:
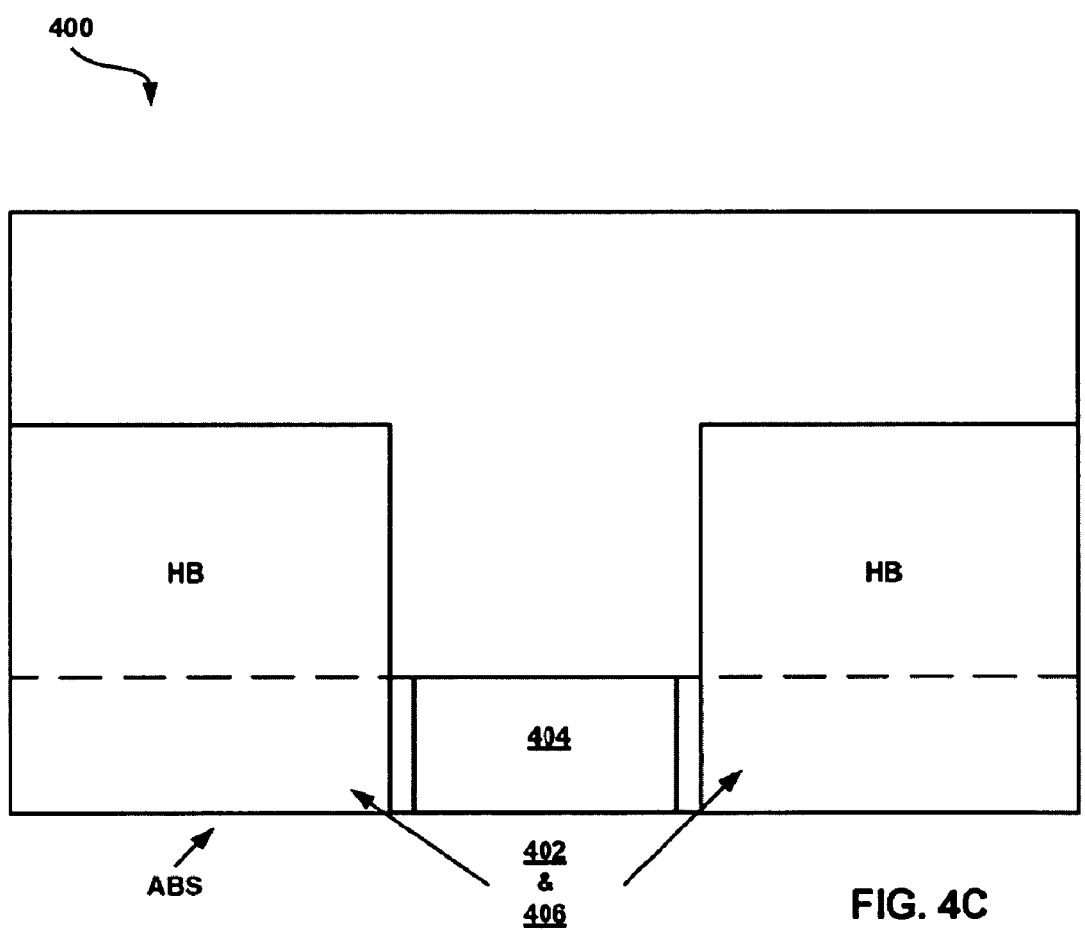
Figure 4D:
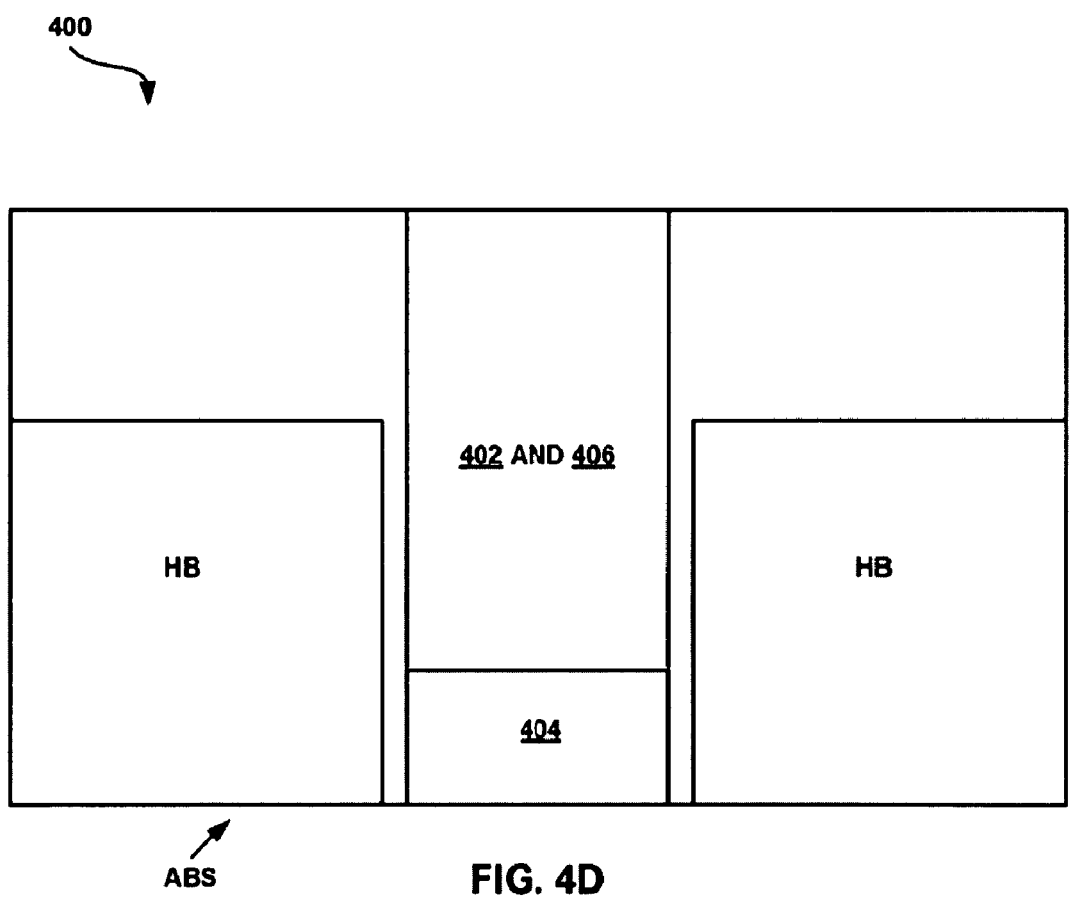
Figure 4E:
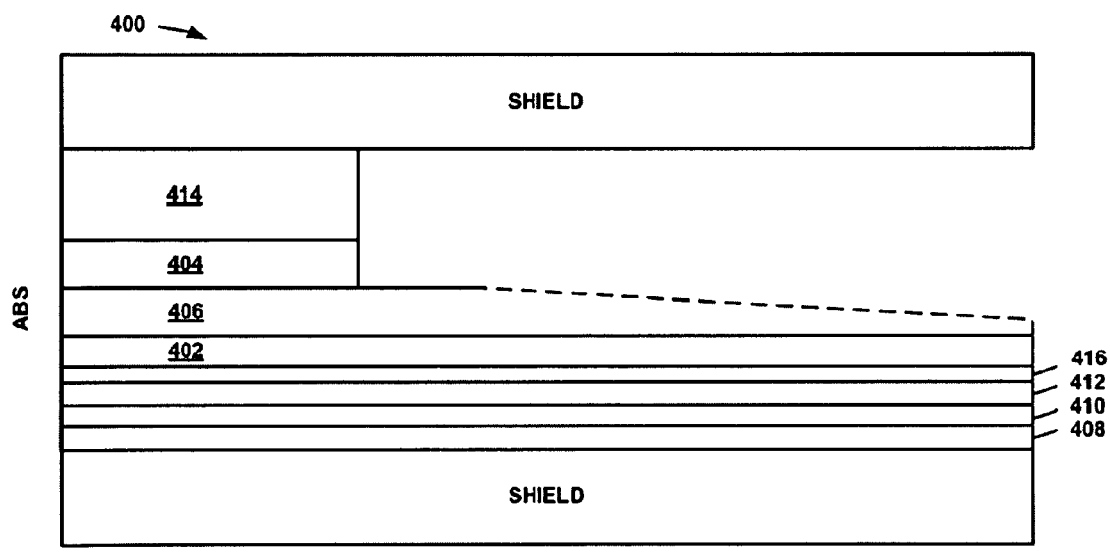
FIG. 4E illustrates a cross-sectional view of the magnetic structure of FIG. 4A, in accordance with one embodiment.

FIG. 4A illustrates an air bearing surface (ABS) view of a magnetic structure 400, in accordance with one embodiment. FIGS. 4B-4D illustrate top down views of the magnetic structure 400, in accordance with various embodiments. FIG. 4E illustrates a cross-sectional view of the magnetic structure 400, in accordance with one embodiment.

As shown, the magnetic structure 400 includes a tunnel barrier layer 402, a free layer 404, and a buffer layer 406 between the tunnel barrier layer 402 and the free layer 404, where a cross sectional area of the tunnel barrier layer 402 in a plane parallel to a plane of deposition thereof is greater than a cross sectional area of the free layer 404 in a plane parallel to a plane of deposition thereof (e.g. see FIGS. 4B-4D). Furthermore, a cross sectional area of the buffer layer 406 in a plane parallel to a plane of deposition thereof is greater than a cross sectional area of the free layer 404 in the plane parallel to the plane of deposition thereof (e.g. see FIGS. 4B-4D).

In some embodiments, and as shown in FIGS. 4B-4D, the buffer layer 406 and the tunnel barrier layer 402 may be about coextensive. In other embodiments, the buffer layer 406 and the tunnel barrier layer 402 may not be coextensive. In other words, one layer may have a larger total cross-sectional area than the other layer. For example, in one embodiment, the tunnel barrier layer 402 may be deposited full film and the buffer layer 406 may only be as wide as the free layer but higher than the free layer (e.g. the tunnel barrier layer 402 configured as shown in FIG. 4B and the buffer layer 406 configured as shown in FIG. 4D). In another embodiment, the tunnel barrier layer 402 may be deposited full film and the buffer layer 406 may only be as high as the free layer (e.g. see FIGS. 4A and 4C) but wider than the free layer. In yet further embodiments, the buffer layer 406 is not coextensive with the tunnel barrier layer 402 in any direction, except perhaps along the ABS edges thereof.

As shown further in FIG. 4D, the magnetic structure 400 may have an air bearing surface, where widths of the tunnel barrier layer 402 and the buffer layer 406 in a direction parallel to the air bearing surface and planes of deposition thereof is about the same as a width of the free layer 404. In another embodiment, the magnetic structure 400 may have an air bearing surface, where widths of the tunnel barrier layer 402 and the buffer layer 406 in a direction parallel to the air bearing surface is greater than a width of the free layer 404 (e.g. see FIG. 4C).

As another option, the magnetic structure 400 may have an air bearing surface, where heights of the tunnel barrier layer 402 and the buffer layer 406 in a direction perpendicular to the air bearing surface is about the same as a height of the free layer 404 (e.g. see FIG. 4C). In this case, widths of the tunnel barrier layer 402 and the buffer layer 406 in a direction parallel to the air bearing surface may be greater than a width of the free layer 404 (e.g. see FIG. 4C).

In still another embodiment, the magnetic structure 400 may have an air bearing surface, where heights of the tunnel barrier layer 402 and the buffer layer 406 in a direction perpendicular to the air bearing surface is greater than a height of the free layer 404 (e.g. see FIG. 4D). In this case, widths of the tunnel barrier layer 402 and the buffer layer 406 in a direction parallel to the air bearing surface may be about the same as a width of the free layer 404 (e.g. see FIG. 4D).

As another option, a portion of the buffer layer 406 not adjacent the free layer 404 in a direction perpendicular to a plane of deposition thereof may have a thickness that is less than a thickness of a portion of the buffer layer 406 that is adjacent the free layer 404 in a direction perpendicular to the plane of deposition thereof (e.g. see angled upper surfaces of the buffer layer 406 in FIG. 4A). In one case, this may be a result of removal of a top portion of the buffer layer 406 during definition of a track width and/or height of the free layer 404. In other embodiments, the buffer layer 406 may have about a constant thickness thereacross, as represented by the dashed lines in FIG. 4A.

It should be noted that the tunnel barrier layer 402, the free layer 404, and the buffer layer 406 may be constructed of any suitable material. For example, in one embodiment, the buffer layer 406 may include Cu, Mg, Au, Ag, etc. Particularly preferred embodiments have a buffer layer 406 having a material having a long spin-diffusion length. As another example, the tunnel barrier layer 402 may include $SiO_2$, $AlO_x$, $TiO_x$, $AlO_3$, $MgO_x$, etc.; and the free layer 404 may include NiFe, CoFe, etc., and/or any other suitable material.

In another embodiment, the buffer layer 406 may be between and immediately adjacent the tunnel barrier layer 402 and the free layer 404, where cross sectional areas of the tunnel barrier layer 402 and the buffer layer 406 in a plane parallel to planes of deposition thereof are each greater than a cross sectional area of the free layer 404 in a plane parallel to a plane of deposition thereof (e.g. see FIG. 4A). Further, the magnetic structure 400 may have an air bearing surface, where a cross sectional area of the tunnel barrier layer 402 in a plane parallel to a plane of deposition thereof may be greater than cross sectional area of the free layer 404 in a plane parallel to a plane of deposition thereof (e.g. see FIG. 4A). Additionally, a cross sectional area of the buffer layer 406 in a plane parallel to a plane of deposition thereof may be greater than a cross sectional area of the free layer 404 in the plane parallel to the plane of deposition thereof. In this case, the buffer layer 406 and the tunnel barrier layer 402 may or may not be about coextensive.

It should be noted, that any suitable combinations and configurations illustrated in FIGS. 4A-4E may be utilized. For example, although FIGS. 4B-4D illustrate the tunnel barrier layer 402 and the buffer layer 406 as coextensive, such layers are not limited to such, as noted above. For example, the tunnel barrier layer 402 may be configured as shown in FIG. 4B and the buffer layer 406 may be configured as shown in FIG. 4C or 4D. In another case, the buffer layer 406 may be configured as shown in FIG. 4B and the tunnel barrier layer 402 may be configured as shown in FIG. 4C or 4D.

Further, as shown in FIG. 4A, the magnetic structure 400 may optionally include various other components [e.g. shields, a hard bias layer, a seed layer 408, an antiferromagnetic (AFM) layer 410 (e.g. IrMn, etc.), a pinned layer 412 (e.g. a traditional pinned layer or a synthetic antiferromagnetic pinned layer structure), a cap 414, a spacer 416, etc.]. In one embodiment, the magnetic structure 400 may include hard bias layers HB flanking the free layer 404.

As an option, the magnetic structure 400 may be included in a magnetic storage system such at that represented by FIG. 1. Additionally, the magnetic storage system may further include a magnetic medium, at least one head for reading from and writing to the magnetic medium, a slider for supporting the head, and a control unit coupled to the head for controlling operation of the head. In this case, the head may include a sensor comprising the magnetic structure 400.

Figure 5:
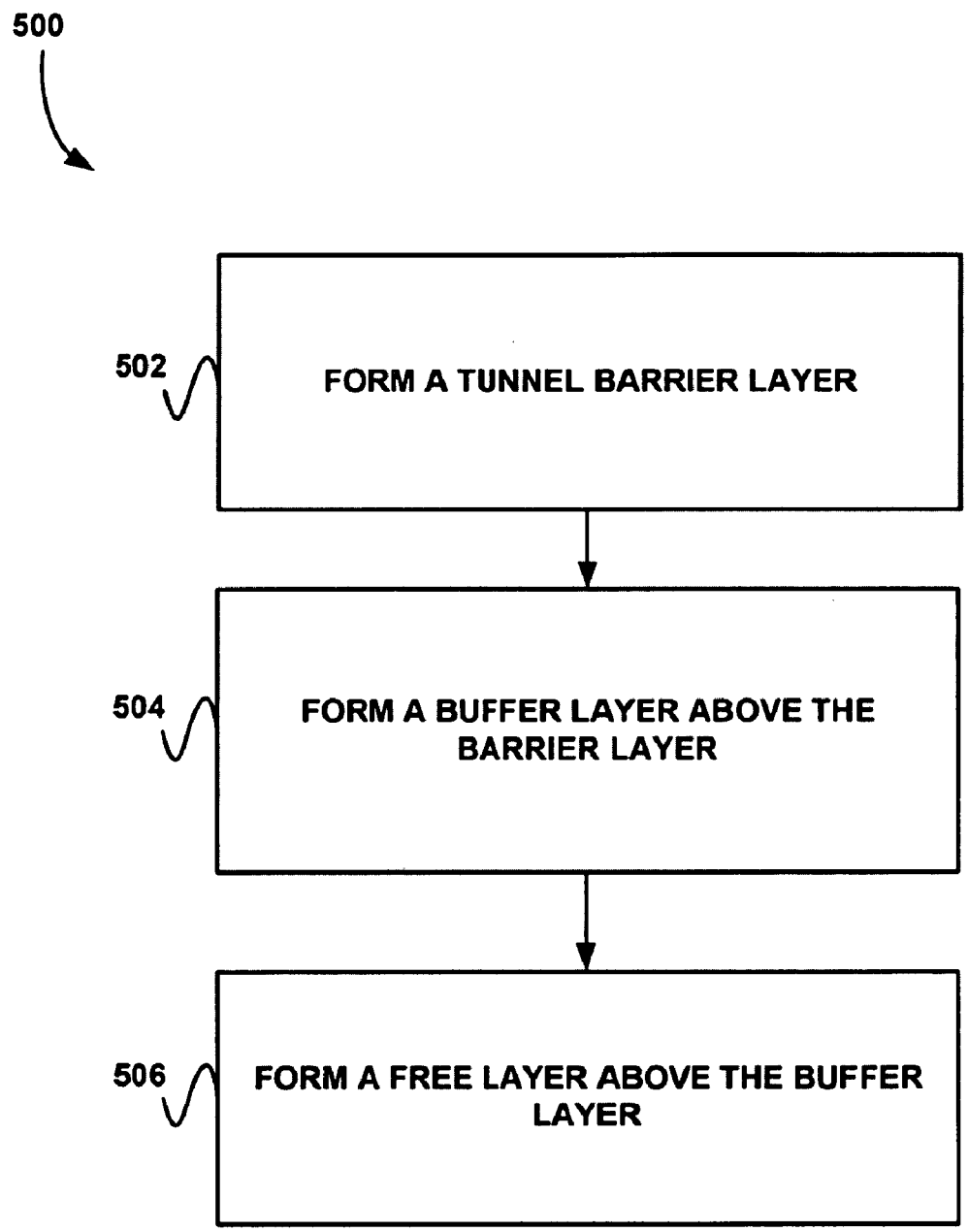
FIG. 5 shows a method for fabricating a magnetic structure, in accordance with one embodiment.

FIG. 5 shows a method 500 for fabricating a magnetic structure, in accordance with one embodiment. As shown, a tunnel barrier layer is formed. See operation 502. Additionally, a buffer layer is formed above the tunnel barrier layer.

See operation 504. As an option, the buffer layer may be formed directly on the barrier layer.

Further, a free layer is formed above the buffer layer such that a cross sectional area of the tunnel barrier layer in a plane parallel to a plane of deposition thereof is greater than a cross sectional area of the free layer in a plane parallel to a plane of deposition thereof, and such that a cross sectional area of the buffer layer in a plane parallel to a plane of deposition thereof is greater than a cross sectional area of the free layer in the plane parallel to the plane of deposition thereof. See operation 506. Optionally, the free layer may be formed directly on the buffer layer.

As another option, the method 500 may be implemented such that a free layer is formed before the buffer layer. Accordingly, the buffer layer may be formed above, and preferably directly on, the free layer. Additionally, a tunnel barrier layer may be formed above, and preferably directly on, the buffer layer. In this case, a cross sectional area of the tunnel barrier layer in a plane parallel to a plane of deposition thereof may be greater than a cross sectional area of the free layer in a plane parallel to a plane of deposition thereof, and a cross sectional area of the buffer layer in a plane parallel to a plane of deposition thereof is greater than a cross sectional area of the free layer in the plane parallel to the plane of deposition thereof.

In one embodiment, forming the free layer may include removing portions of the free layer. For example, reactive ion etching (RIE) or milling may be utilized to remove portions of the free layer. Furthermore, upper portions of the buffer layer may be removed in areas flanking the free layer, using RIE, milling, or another suitable technique. For example, once the buffer layer is inserted between the free layer and the tunnel barrier of a sensor film [e.g. a tunnel magnetoresistance (TMR) film, etc.], the film may be patterned top-down into a standard narrow track and height sensor geometry, completely patterning through the free layer but only to or partially through the inserted buffer layer.

In the latter case, the partial patterning results in a sensor with a small magnetic sensing area defined by the free layer geometry but a large tunneling area defined by the buffer layer geometry. During operation, spin polarized current from the free layer may fan out into the long spin-diffusion length buffer layer and tunnel across the barrier over an area substantially larger than the sensing area, thereby significantly reducing head resistance and shot noise, without significant loss of spin polarization.

In various embodiments, 1-D or 2-D area extensions may be utilized along the track width and/or sensor height directions for different magnitudes of resistance and shot noise reduction effect. Utilizing area extension along sensor height may also yield benefits of better pinned layer stability and lower pinned layer magnetic noise.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A magnetic structure, comprising:
   a tunnel barrier layer;
   a free layer;
   a buffer layer between the tunnel barrier layer and the free layer; and
   hard bias layers flanking the free layer in a cross-track direction, wherein portions of the tunnel barrier layer and the buffer layer extend below the hard bias layers in the cross-track direction,
   wherein a cross sectional area of the tunnel barrier layer in a plane parallel to a plane of deposition thereof is greater than a cross sectional area of the free layer in a plane parallel to a plane of deposition thereof,
   wherein a cross sectional area of the buffer layer in a plane parallel to a plane of deposition thereof is greater than a cross sectional area of the free layer in the plane parallel to the plane of deposition thereof,
   wherein a height of the tunnel barrier layer is greater than a height of the free layer.

2. A structure as recited in claim 1, wherein the buffer layer and the tunnel barrier layer are about coextensive.

3. A structure as recited in claim 1, wherein the buffer layer and the tunnel barrier layer are not coextensive.

4. A structure as recited in claim 1, wherein the structure has an air bearing surface, wherein widths of the tunnel barrier layer and the buffer layer in a direction parallel to the air bearing surface and planes of deposition thereof is about the same as a width of the free layer.

5. A structure as recited in claim 1, wherein the structure has an air bearing surface, wherein widths of the tunnel barrier layer and the buffer layer in a direction parallel to the air bearing surface is greater than a width of the free layer.

6. A structure as recited in claim 1, wherein the structure has an air bearing surface, wherein heights of the tunnel barrier layer and the buffer layer in a direction perpendicular to the air bearing surface is greater than a height of the free layer.

7. A structure as recited in claim 6, wherein widths of the tunnel barrier layer and the buffer layer in a direction parallel to the air bearing surface is mater than a width of the free layer.

8. A structure as recited in claim 1, wherein a portion of the buffer layer not adjacent the free layer has a thickness in a direction perpendicular to a plane of deposition thereof that is less than a thickness of a portion of the buffer layer that is adjacent the free layer in the direction perpendicular to the plane of deposition thereof.

9. A structure as recited in claim 8, wherein the structure has an air bearing surface, wherein the portion of the buffer layer that is not adjacent the free layer is positioned on either side of the free layer in a cross-track direction and/or above the free layer in a direction perpendicular to the air bearing surface.

10. A structure as recited in claim 9, wherein widths of the tunnel barrier layer and the buffer layer at the air bearing surface in a direction parallel to the air bearing surface is greater than a width of the free layer.

11. A structure as recited in claim 1, wherein the buffer layer comprises a material selected from the group consisting of: Cu and Mg.

12. A structure as recited in claim 1, wherein a sensor of a magnetic head for reading from and writing to magnetic media comprises the structure.

13. A magnetic structure, comprising:
   a tunnel barrier layer;
   a free layer;
   a buffer layer between and immediately adjacent the tunnel barrier layer and the free layer; and
   hard bias layers flanking the free layer in a cross-track direction,
   wherein cross sectional areas of the tunnel barrier layer and the buffer layer in planes parallel to planes of deposition thereof are each greater than a cross sectional area of the free layer in a plane parallel to a plane of deposition thereof, wherein the structure has an air bearing surface, and wherein portions of the tunnel barrier layer extend in the cross-track direction below the hard bias layers.

14. A structure as recited in claim 13, wherein the buffer layer and the tunnel barrier layer are about coextensive.

15. A structure as recited in claim 13, wherein the buffer layer and the tunnel barrier layer are not coextensive.

16. A structure as recited in claim 13, wherein heights of the tunnel barrier layer and the buffer layer in a direction perpendicular to the air bearing surface is about the same as a height of the free layer.

17. A structure as recited in claim 13, wherein heights of the tunnel barrier layer and the buffer layer in a direction perpendicular to the air bearing surface is greater than a height of the free layer.

18. A structure as recited in claim 13, wherein a portion of the buffer layer not adjacent the free layer has a thickness in a direction perpendicular to the plane of deposition thereof that is less than a thickness of a portion of the buffer layer that is adjacent the free layer in a direction perpendicular to the plane of deposition thereof.

19. A structure as recited in claim 13, wherein the buffer layer comprises a material selected from the group consisting of: Cu and Mg.

20. A structure as recited in claim 13, wherein a sensor of a magnetic head for reading from and writing to magnetic media comprises the structure.

21. A magnetic storage system, comprising:
magnetic media:
at least one head for reading from and writing to the magnetic media, the at least one head having:
a sensor, comprising:
a tunnel barrier layer;
a free layer; and
a buffer layer between and immediately adjacent the tunnel barrier layer and the free layer; and
hard bias layers flanking the free layer in a cross-track direction,
wherein a cross sectional area of the tunnel barrier layer in a plane parallel to a plane of deposition thereof is greater than a cross sectional area of the free layer in a plane parallel to a plane of deposition thereof,
wherein a cross sectional area of the buffer layer in a plane parallel to a plane of deposition thereof is greater than a cross sectional area of the free layer in the plane parallel to the plane of deposition thereof,
wherein the structure has an air bearing surface, and
wherein portions of the tunnel barrier layer extend in the cross-track direction below the hard bias layers;
a slider for supporting the head; and
a control unit coupled to the head for controlling operation of the head.

22. A method, comprising:
forming a tunnel barrier layer;
forming hard bias layers flanking the free layer in a cross-track direction such that portions of the tunnel barrier layer extend in the cross-track direction below the hard bias layers;
forming a buffer layer immediately above the tunnel barrier layer;
forming a free layer immediately above the buffer layer such that a cross sectional area of the tunnel barrier layer in a plane parallel to a plane of deposition thereof is greater than a cross sectional area of the free layer in a plane parallel to a plane of deposition thereof, and such that a cross sectional area of the buffer layer in a plane parallel to a plane of deposition thereof is greater than a cross sectional area of the free layer in the plane parallel to the plane of deposition thereof; and
forming an air bearing surface.

23. A method as recited in claim 22, wherein forming the free layer comprises removing portions of the free layer.

24. A method as recited in claim 23, further comprising removing upper portions of the buffer layer in areas flanking the free layer.

25. A method, comprising:
forming a free layer;
forming hard bias layers on either side of the free layer in a cross-track direction;
forming a buffer layer above the free layer; and
forming a tunnel barrier layer above the buffer layer,
wherein across sectional area of the tunnel barrier layer in a plane parallel to a plane of deposition thereof is greater than a cross sectional area of the free layer in a plane parallel to a plane of deposition thereof,
wherein a cross sectional area of the buffer layer in a plane parallel to a plane of deposition thereof is greater than a cross sectional area of the free layer in the plane parallel to the plane of deposition thereof,
wherein portions of the tunnel barrier layer and the buffer layer extend below the hard bias layers in the cross-track direction, and
wherein a height of the tunnel barrier layer is greater than a height of the free layer.

* * * * *